United States Patent
Ohkubo et al.

[19]
[11] Patent Number: 6,093,657
[45] Date of Patent: *Jul. 25, 2000

[54] FABRICATION PROCESS OF SEMICONDUCTOR DEVICE

[75] Inventors: Satoru Ohkubo; Kensuke Kasahara, both of Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/855,612

[22] Filed: May 13, 1997

[30] Foreign Application Priority Data

May 20, 1996 [JP] Japan .................................. 8-125049

[51] Int. Cl.⁷ .................................................. H01L 21/302
[52] U.S. Cl. ............................ 438/745; 438/752; 438/753
[58] Field of Search ..................................... 438/745, 752, 438/753, 718

[56] References Cited

U.S. PATENT DOCUMENTS

| | | | |
|---|---|---|---|
| 5,374,328 | 12/1994 | Remba et al. | 438/745 |
| 5,419,808 | 5/1995 | Kitano | 438/745 |
| 5,468,343 | 11/1995 | Kitano | 438/745 |
| 5,696,035 | 12/1997 | Kitano | 438/172 |
| 5,783,856 | 7/1998 | Smith et al. | 257/618 |
| 5,786,234 | 7/1998 | Nagai et al. | 438/47 |
| 5,824,186 | 10/1998 | Smith et al. | 216/2 |
| 5,904,572 | 5/1999 | Lee et al. | 438/745 |
| 5,928,964 | 7/1999 | Brankner | 438/714 |

FOREIGN PATENT DOCUMENTS

| | | |
|---|---|---|
| 54-36185 | 3/1979 | Japan . |
| 60-83335 | 5/1985 | Japan . |
| 61-54677 | 3/1986 | Japan . |
| 4-206523 | 7/1992 | Japan . |
| 5-36670 | 2/1993 | Japan . |
| 6-97150 | 4/1994 | Japan . |
| 6-310425 | 11/1994 | Japan . |
| 7-307528 | 11/1995 | Japan . |

OTHER PUBLICATIONS

Tong et al., "A Comparative Study of Wet and Dry Selective Etching Processes for GaAS/AlGaAS/InGaAS Pseudomorphic", Journal of Electronic Materials vol. 21, No. 1, pp. 9–14, 1992.

Schneider et al., "Characteristics of nonselective GaAs/(Al, Ga)Aa heterostructure etching at very low etch", SPIE vol. 797, Advanced Processing of Semiconductor Devices, pp. 149–155, 1987.

Otsubo et al., "Preferential Etching of GaAs Through Photoresist Masks", J. Electochem. Soc., Solid–State Science And Technology, vol. 123, No. 6, pp. 676–680, 1976.

Tominaga et al., "Application of Selective Wet Etching for MODFET", The Institute of Electronics, Information and Communication Engineers, pp. 5–152, 1993.

*Primary Examiner*—Benjamin L. Utech
*Assistant Examiner*—Lynette T. Umez-Eronini
*Attorney, Agent, or Firm*—Foley & Lardner

[57] ABSTRACT

A compound semiconductor wafer is dipped into water at a temperature of 5° C. for about 10 seconds to preliminarily adjust to a temperature substantially equal to a temperature of etching agent. Next, with taking a photoresist as a mask, etching is performed at 5° C. employing a mixture of 50 wt % of citric acid solution and 30 wt % of hydrogen peroxide solution in a volume ratio of 3:1. Thereafter, gate metal is deposited, and the mask and excessive metal are removed by a lift-off or other method to fabricate a semiconductor device.

12 Claims, 3 Drawing Sheets

FIG. IA
(PRIOR ART)
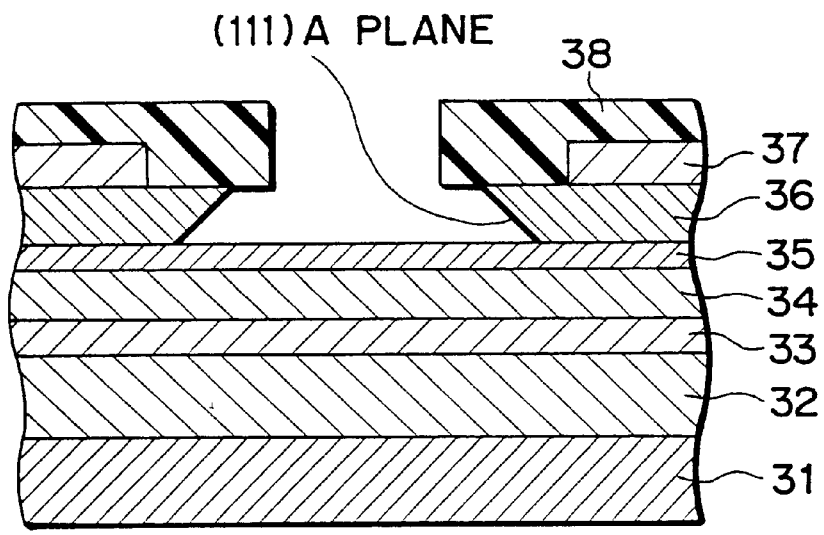
FIG. IB
(PRIOR ART)
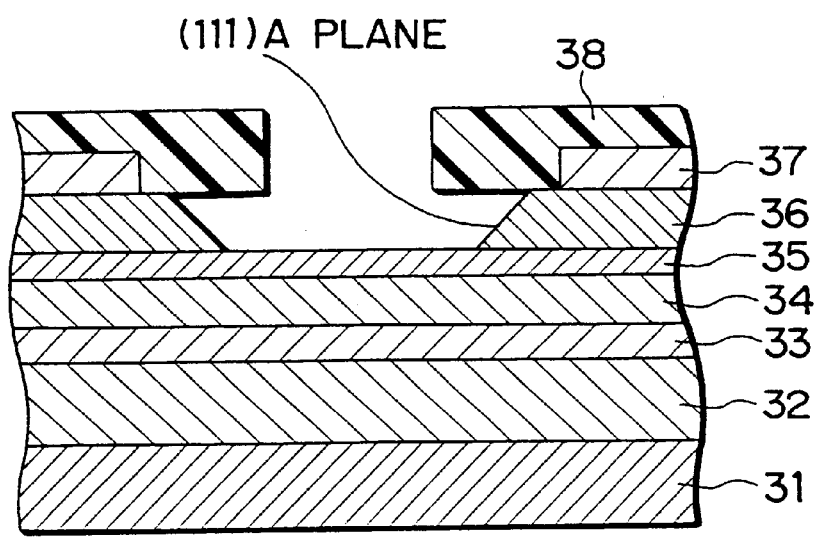

FABRICATION PROCESS OF SEMICONDUCTOR DEVICE

BACKGROUND OF THE INVENTION

1. Field of the Invention

The present invention relates generally to a fabrication process of a semiconductor device employing citric acid type etching agent. More specifically, the invention relates to a fabrication process of a semiconductor device, in which side etching is restricted.

2. Description of the Prior Art

Conventionally, citric acid type etching agent as a mixture of citric acid aqueous solution and hydrogen peroxide solution, is used in selective wet etching of GaAs/AlGaAs. The citric acid type etching agent has high etching selection ratio of GaAs versus $Al_xGa_{1-x}As$ ($0 \leq x \leq 1$) and thus permits fabrication of a device superior in uniformity of a threshold voltage. For example, an excellent result wherein an etching selection ratio of GaAs versus AlAs is 1450, the standard deviation $\sigma Vt$ of the threshold voltage is 13.5 mV, was able to be obtained (M. Tong et al., "A Comparative Study of Wet and Dry Selective Etching Process for GaAs/AlGaAs/InGaAs Pseudomorphic MODFETS", Journal of Electronic Materials, 9–14, Vol. 21, No. 1 (1992)). On the other hand, there have been reported other etching processes of a semiconductor device employing citric acid type etching agent (Mitsuyuki Otsubo et al., "Preferential Etching of GaAs Through Photoresist Masks", J. Electrochem. Soc., SOLID-STATE SCIENCE AND TECHNOLOGY, 676–680, Vol. 123, No. 5 (1976), and M. Schneider et al., "Characteristics of nonselective GaAs /(Al, Ga)As heterostructure etching at very low etch rate", SPIE Vol. 797, Advanced Processing of Semiconductor Devices, 149–155 (1987)). Also, by performing selective etching employing a mixture liquid of citric acid aqueous solution and hydrogen peroxide solution, uniformity of a drain current and the minimum noise factor was able to be obtained (Hisaaki Tominaga et al., "Application of Selective Wet Etching for MODFET", 5–152, The Institute of Electronics, Information and Communication Engineers, Spring Meeting (1993)).

One example of the conventional fabrication process of a semiconductor device employing the citric acid type etching agent will be discussed. FIGS. 1A and 1B are sections showing a semiconductor device which was fabricated through a conventional fabrication process. FIG. 1A illustrates a section as the (011) plane of the substrate, and FIG. 1B illustrates a section as the (0$\bar{1}$1) plane of the substrate. First, on the surface of the semi-insulating-GaAs substrate 31 having plane orientation of the [100] direction, an intrinsic-GaAs layer 32 as a buffer layer, an i-InGaAs layer 33 as a channel layer, an n-AlGaAs layer 34 as a supply layer, an AlAs layer 35 as a stopper layer and an n-GaAs layer 36 as a contact layer are sequentially stacked in order. Next, ohmic metal 37 is deposited and heat treatment is performed to form ohmic contacts.

Next, photoresist 38 is deposited. Then, the n-GaAs layer 36 is etched at 20° C. employing the citric acid type etching agent with taking the photoresist 38 as a mask. Thereafter, etching is stopped with water at a temperature of 20° C., and the wafer is washed. Subsequently, a gate metal layer is deposited on the n-AlGaAs layer 34. Then, by a lift-off method or the like, the mask and extra metal are removed to fabricate a semiconductor device.

However, in the device fabricated employing the foregoing method, as shown in FIG. 1, on the (011) plane and the (0$\bar{1}$1) plane, etching in a transverse direction at the mask, so-called side etching is progressed. It should be noted that, in the (111) plane, a plane exposing Ga will be hereinafter referred to as the (111)A plane and a plane exposing As will be hereinafter referred to as the (111)B plane. An etching rate in the side etching depends upon the etching rate on the (111)A plane. When the side etching is caused, adverse effects in that source resistance is increased, surface level is affected with the n-AlGaAs layer 34 exposed and so forth, can be caused.

In order to solve such a problem, there is a method to restrict the side etching by adjusting an etching period. This method requires strict time control is difficulty to control, and thus is not desirable in view point of reproducibility and uniformity.

In a method employing a dry etching method in order to avoid the side etching, problems are encountered as requiring a large scale device and as being possible to cause damage to the semiconductor device for performing physical polishing.

On the other hand, in the conventional fabrication process, water at the room temperature is employed for stopping etching. Etching of a wafer is slightly progressed until the etching agent is sufficiently diluted to cause overetching or variation of etching.

Furthermore, when temperature variation due to reaction heat in the water as stopping liquid, or the like, variation of etching due to the overetching upon stopping of etching can be increased.

SUMMARY OF THE INVENTION

It is therefore an object of the present invention to solve the problem as set forth above and thus to provide a fabrication process for fabricating a device superior in production yield, uniformity and reproducibility.

A fabrication process of a semiconductor device, according to the present invention, has an etching step of etching a compound semiconductor wafer employing etching agent consisted of a mixture of at least citric acid solution and hydrogen peroxide solution at a temperature lower than or equal to 15° C.

Also, the fabrication process may stop etching by dipping the compound semiconductor wafer into water at a temperature substantially equal to or lower than a temperature of the etching agent, after the etching step.

Furthermore, in the fabrication process of the semiconductor device, the compound semiconductor is one kind of compound semiconductor selected from a group consisted of GaAs, AlAs, InAs, GaP, AlP, InP and compound semiconductor consisted thereof.

The compound semiconductor wafer may has one kind of semiconductor multi-layer structure selected from a group consisted of semiconductor multi-layer structure consisted of at least $In_aG_{1-a}aAs$ layer ($0 \leq a \leq 1$) and $Al_bGa_{1-b}As$ layer ($0 < b \leq 1$), semiconductor multi-layer structure consisted of at least $In_cGa_{1-c}As$ layer ($0 \leq c \leq 1$) and $In_dAl_{1-d}As$ layer ($0 \leq d \leq 1$), semiconductor multi-layer structure consisted of at least $In_eGa_{1-e}As$ layer ($0 \leq e \leq 1$) and InP layer, and semiconductor multi-layer structure consisted of at least $In_fAl_{1-f}As$ layer ($0 < f \leq 1$) and InP layer.

In a fabrication process of the semiconductor device, the compound semiconductor may be a field effect transistor which has a gate whose direction is parallel to the [011] direction or the [0$\bar{1}$1] direction on the (100) plane.

The fabrication process of a semiconductor device may comprise a temperature adjusting step of adjusting temperature of said compound semiconductor to be substantially equal to or lower than the temperature of said etching agent.

In a fabrication process of the semiconductor device, a method for adjusting temperature of the compound semiconductor wafer to be substantially equal to or lower than the temperature of the etching agent, may be to dip the compound semiconductor wafer into water at a temperature substantially equal to or lower than the temperature of the etching agent.

In a fabrication process of the semiconductor device, the period to dip the compound semiconductor wafer into water may be about 10 seconds.

In a fabrication process of the semiconductor device, a method for adjusting temperature of the compound semiconductor wafer to be substantially equal to or lower than the temperature of the etching agent, may be to dip the compound semiconductor wafer into a constant temperature bath at a temperature substantially equal to or lower than the temperature of the etching agent.

The mixture may be a mixture of citric acid solution and hydrogen peroxide solution in a volume ratio of 3:1.

In the fabrication process of a semiconductor device, the mixture may contain potassium citrate.

According to the present invention, since etching of the compound semiconductor wafer is performed at a low temperature lower than or equal to 15° C., etching can be controlled in the (111)B plane having the low etching rate. Therefore, formation of side etching in the device can be avoided.

Furthermore, by dipping the compound semiconductor wafer into water at a temperature substantially equal to that of the etching agent before and after etching, controllability of the etching rate can be improved. It should be noted that this method is not limited to the process of the compound semiconductor wafer but may achieve improvement of controllability for any etching.

Particularly, by employing a method to adjust the temperature of the compound semiconductor wafer to be substantially equal to that of the etching agent before etching, the etching process can be done with a small amount of etching agent even for a large wafer to be etched, which has large heat capacity. Thus, load for waste disposal can be reduced.

By performing etching in this method, influence for surface level due to source resistance, drain lag or so forth can be reduced, and thus the device superior in production yield, reproducibility and uniformity, having no defect, can be fabricated.

Furthermore, by setting the gate direction parallel to the [011] direction, etching of the recession is controlled at the (111)B plane. Thus, the width of the bottom of the recession becomes narrower than that at the opening portion. Therefore, reduction of channel length of the gate can be facilitated to cause improving characteristics of increasing of frequency of the FET.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to be present invention, but are for explanation and understanding only.

In the drawings:

FIGS. 1A and 1B are sections of a semiconductor device fabricated through a conventional fabrication process, in which FIG. 1A shows a section as the (011) plane of the substrate and FIG. 1B shows a section as the (0$\bar{1}$1) plane of the substrate;

FIGS. 3A and 3B are sections of a semiconductor device fabricated through the preferred embodiment of a fabrication process according to the present invention, in which FIG. 3A shows a section as the (011) plane of the substrate and FIG. 3B shows a section as (0$\bar{1}$1) plane of the substrate.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscuring the present invention.

First, discussion will be given with respect to the reason for limitation of a liquid temperature of a mixture to be used for the preferred embodiment of an etching process according to the present invention.

Figure 2:
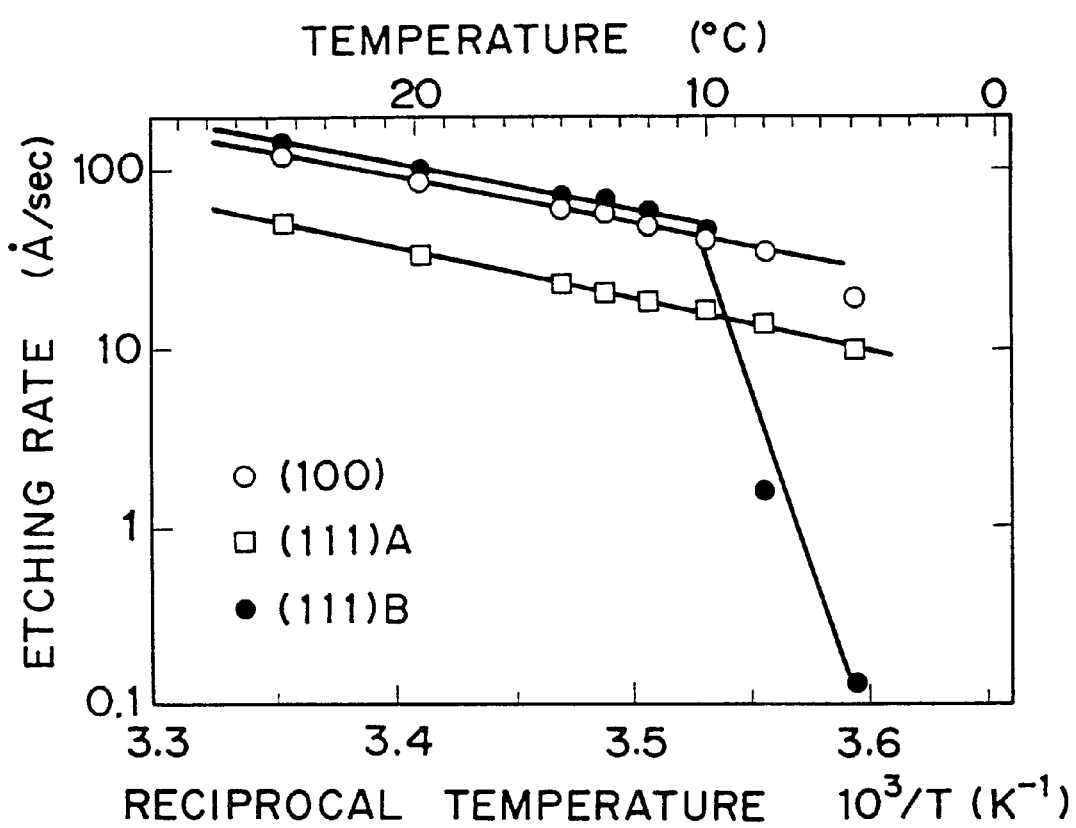
FIG. 2 is a graph showing a relationship between a temperature of the etching agent and an etching rate, in which the horizontal axis represents the temperature of the etching agent and the vertical axis represents the etching rate.

The inventors have performed investigation for temperature dependency of an etching rate at various planes of GaAs upon etching therefor with employing etching agent as a mixture of 50 wt % of citric acid aqueous solution and 30 wt % of hydrogen peroxide solution ($H_2O_2$) in a volume ratio of 3:1. FIG. 2 is a graph showing a relationship between a temperature of the etching agent and an etching rate, in which the horizontal axis represents the temperature of the etching agent and the vertical axis represents the etching rate. As seen from FIG. 2, in any of the (100) plane, the (111)A plane and the (111)B plane, the etching rate is lowered according to lowering of the temperature. In particular, in the (111)B plane, the etching rate is abruptly reduced across about 15° C. Therefore, when the temperature of the etching agent is lower than or equal to 15° C., etching can be performed under the condition where the etching rate is so low as to extremely facilitate control of side etching. Accordingly, the temperature of the mixture liquid to be used for etching is set to be less than or equal to 15° C.

Figure 3A:
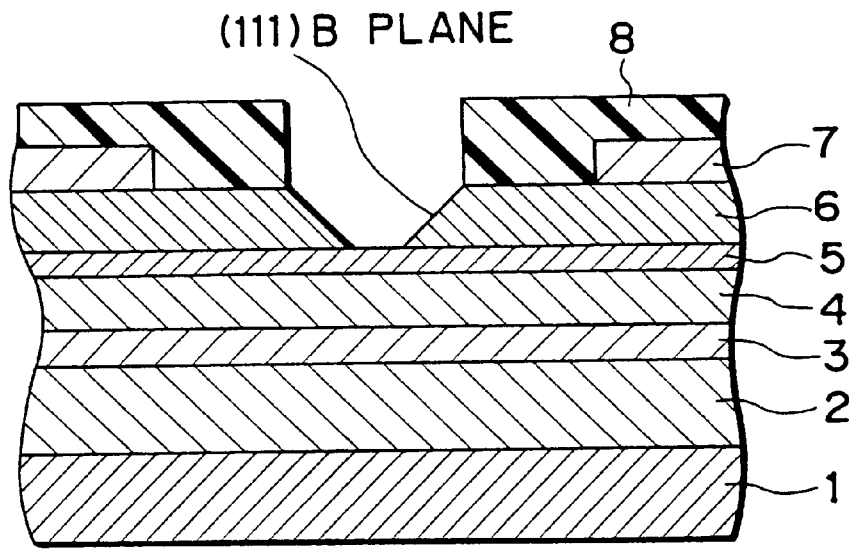

Next, the preferred embodiment of the present invention will be specifically discussed with reference to the accompanying drawings, particularly to FIGS. 3A and 3B, which are sections of a semiconductor device fabricated through the preferred embodiment of a fabrication process according to the present invention, in which FIG. 3A shows a section as the (011) plane of the substrate and FIG. 1B shows a section as the (0$\bar{1}$1) plane of the substrate. First, the preferred embodiment of the fabrication process of a semiconductor device according to the present invention will be described. On a semi-insulative GaAs substrate 1 having plane orientation of the [100] direction, an intrinsic-GaAs layer 2 as a buffer layer and having thickness of 0.5 $\mu$m, $I_{0.15}Ga_{0.85}As$ layer 3 as a channel layer and having thickness of 15 nm, $Al_{0.2}Ga_{0.8}As$ layer 4 (concentration $2\times10^{18}$ cm$^{-3}$) as a supply layer and having thickness of 38 nm, AlAs layer 5 (concentration $2\times10^{18}$ cm$^{-3}$) as a stopper layer and having thickness of 2 nm, and GaAs 6 (concentration $3\times10^{18}$ cm$^{-3}$) as a contact layer and having thickness of 60 nm are grown in sequential order by way of MOCVD or MBE to form a multi-layer compound semiconductor. Next, ohmic metal is deposited and heat treatment is performed to form an ohmic contact.

Next, the wafer thus formed is dipped into water at a temperature of 5° C. for about 10 min or longer so that the temperature of the wafer is the same as a temperature of etching agent to be used in the next process step. Then, a photoresist layer is stacked for serving as a mask. Etching for n-GaAs layer 4 is performed with employing the mixture of 50 wt % of citric acid aqueous solution and 30 wt % of hydrogen peroxide solution in a volume ratio of 3:1, at a temperature of 5° C. Subsequently, by depositing a gate metal, and removing the mask and extra metal by way of a lift-off method, the semiconductor device is fabricated.

Figure 3B:
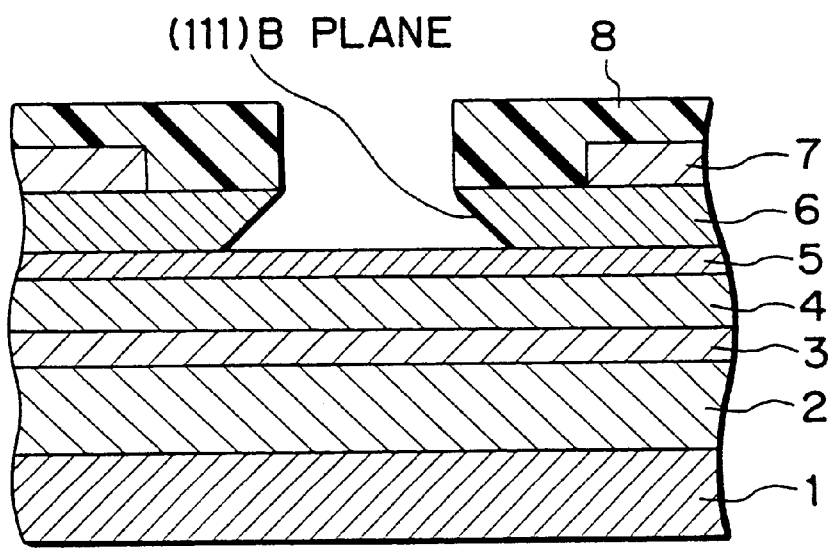

In the preferred embodiment, since etching is performed at a low temperature of 5° C., as shown in FIGS. 3A and 3B, the etching stops at the (100) plane of the n-AlAs layer 5 in the depth direction in either planes and at the (111)B layer of n-GaAs layer 6 in the horizontal direction. Thus, side etching is not formed at the mask.

It should be noted that by dipping the wafer into water at a temperature of 5° C. before and after etching, the temperature of the wafer matches with the temperature of the dipping layer of etching so that variation of etching condition due to temperature difference can be successfully avoided. Therefore, etching can be stopped with high controllability.

With such a method, source resistance can be successfully reduced with shortening distance between a source and a drain. Furthermore, since exposure of the n-AlGaAs layer 4 as the supply layer can be prevented, degradation of characteristics of the device due to gate lag and so forth can be successfully restricted.

Also, when the gate is set in the direction parallel to the [011] direction, a device having a gate length of 0.3 $\mu$m can be fabricated by setting the thickness of the n-GaAs layer 6 as the contact layer at 200 nm even when a mask opening width is 0.6 $\mu$m. Thus, enhancement of characteristics, such as rising of frequency of the FET by shortening of channel, and so forth, can be expected.

It should be noted that the mixture ratio of the etching agent is not limited to the shown ratio. Namely, while the shown embodiment of the present invention employs the etching agent, in which the citric acid aqueous solution and hydrogen peroxide solution in the mixture ratio of 3:1 is employed, it is possible to add potassium citrate or the like as a buffering solution under a condition where a desired selection ratio and plane orientation dependency can be obtained.

Also, in the shown embodiment, while the temperature to perform etching is set at 5° C., the specific temperature is not essentially for the present invention. Any temperature lower than or equal to 15° C., at which a desired selection ratio depending upon the mixture ratio of the etching agent or so forth can be obtained, may be set at.

Furthermore, while the shown embodiment illustrates fabrication of the GaAs/AlGaAs type semiconductor device, the present invention should not be specified to the particular type of the semiconductor device. For instance, the present invention should be applicable for an InGaAs/AlGaAs type semiconductor device, an InGaAs/InAlAs type semiconductor device, an InGaAs/InP type semiconductor device, an InAlAs/InP type semiconductor device and the like.

It should be noted that while the sufficient effect was obtained by dipping the wafer into water at a temperature of 5° C. for about 10 seconds in the shown embodiment, the period for dipping the wafer is variable depending upon thermal conductivity of the wafer and thus not specifically limited. For example, when washing is not necessary before etching, it is possible to place the wafer in a constant temperature bath set at a temperature substantially equal to that of the etching agent, and to take out the wafer from the constant temperature bath immediately before etching to start etching process.

Furthermore, it is also possible for wafer to be preliminarily dipped into etching agent which is not the citric acid etching agent and to be adjusted at the same temperature as the citric acid etching agent. In such case, it has been found that quite high reproducibility of etching, particularly in reproducibility of etching amount and etching uniformity in short period, can be obtained. The method to preliminary set the wafer at a temperature substantially equal to that of the citric acid etching agent before etching with the citric acid etching agent, is particularly effective in etching to be performed at a temperature lower than or equal to a room temperature. This is because that, in general, the etching speed is abruptly increased according to increasing of a temperature of the etching agent, and in the etching at a temperature lower than or equal to the room temperature, even if the wafer at a temperature lower than the temperature of the etching agent, no critical problem such as overetching may be caused while the etching rate may be lowered slightly at first.

Accordingly, before etching, it is important to adjust the temperature of the wafer to be lower than the temperature of the etching agent for stability of the process. Also, by preliminarily adjusting the temperature of the wafer at a temperature substantially equal to that of the etching agent, consumption of the etching agent can be reduced.

In the recent year, in case of silicon, in which enlarging of the wafer is occurring, a wafer having a diameter of 30 cm is about to be realized. According to the present invention, even for such large size wafer having large thermal capacity, etching process can be implemented with a relatively small amount of etching agent.

In the shown embodiment, for a 3 inch wafer, satisfactory etching process was able to be performed with 50 cc of citric acid type etching agent. In contrast to this, in the conventional method, etching for a 3 inch wafer would require greater than or equal to 500 cc of the etching agent. Therefore, the present invention achieves saving of the etching agent to be one tenth of the conventional method.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the features set out in the appended claims.

What is claimed is:

1. A fabrication process of a semiconductor device comprising:

etching a compound semiconductor wafer employing a mask and an etching agent comprising a mixture including at least citric acid solution and hydrogen peroxide solution at a temperature at which an etching speed for the (111) B plane is slower than an etching speed for any other planes and thereby reducing side etching at the mask.

2. The fabrication process of a semiconductor device as set forth in claim 1, wherein said temperature is lower than or equal to 10° C.

3. The fabrication process of a semiconductor device as set forth in claim 1, wherein said other planes include the (100) plane.

4. The fabrication process of a semiconductor device as set forth in claim 1, said other planes include the (111) A plane.

5. The fabrication process of a semiconductor device as set forth in claim 1, wherein said temperature is lower than or equal to 5° C.

6. The fabrication process of a semiconductor device as set forth in claim 1, wherein a principal plane of said compound semiconductor wafer is the (100) plane; and said fabrication process further comprises a step of forming a field effect transistor at the surface of said compound semiconductor wafer, said field effect transistor having a gate extending in the [011] direction or the [0-11] direction of said compound semiconductor wafer.

7. The fabrication process of a semiconductor device as set forth in claim 1, wherein said compound semiconductor is one of GaAs, AlAs, InAs, GaP, AlP, InP or a compound semiconductor formed a combination of one or more of GaAs, AlAs, InAs, GaP, AlP, InP.

8. The fabrication process of a semiconductor device as set forth in claim 1, wherein said compound semiconductor wafer includes a semiconductor multi-layer structure selected from a group of a semiconductor multi-layer structure including at least an $In_aGa_{1-a}As$ layer ($0 \leq a \leq 1$) and an $Al_bGa_{1-b}As$ layer ($0 < b \leq 1$), a semiconductor multi-layer structure including at least an $In_cGa_{1-c}As$ layer ($0 \leq c \leq 1$) and an $In_dAl_{1-d}As$ layer ($0 \leq d < 1$), a semiconductor multi-layer structure including at least an $In_eGa_{1-e}As$ layer ($0 \leq e \leq 1$) and an InP layer, and a semiconductor multi-layer structure including at least an $In_fAl_{1-f}As$ layer ($0 < f \leq 1$) and an InP layer.

9. The fabrication process of a semiconductor device as set forth in claim 1, which further comprising a step of adjusting a temperature of said compound semiconductor wafer to be substantially equal to or lower than the temperature of said etching agent before said step etching said compound semiconductor wafer.

10. The fabrication process of a semiconductor device as set forth in claim 9, wherein said temperature of said compound semiconductor wafer is substantially equal to or lower than 5° C.

11. The fabrication process of a semiconductor device as set forth in claim 11, which further comprising a step of adjusting a temperature of said compound semiconductor wafer to be substantially equal to or lower than the temperature of said etching agent after said step of etching said compound semiconductor wafer.

12. The fabrication process of a semiconductor device as set forth in claim 11, wherein said temperature of said compound semiconductor wafer is substantially equal to or lower than 5° C.

* * * * *